United States Patent
Chen et al.

(10) Patent No.: US 6,440,904 B1
(45) Date of Patent: Aug. 27, 2002

(54) HIGH-TEMPERATURE SUPERCONDUCTOR ARRANGEMENT

(75) Inventors: Makan Chen, Dättwil; Martin Lakner, Birmenstorf; Willi Paul, Wettingen, all of (CH)

(73) Assignee: ABB Research Ltd, Zurich (CH)

( * ) Notice: Subject to any disclaimer, the term of this patent is extended or adjusted under 35 U.S.C. 154(b) by 0 days.

(21) Appl. No.: 09/177,535

(22) Filed: Oct. 23, 1998

(30) Foreign Application Priority Data

Oct. 24, 1997 (DE) .......................................... 197 46 976

(51) Int. Cl.[7] .............................. H01F 6/00; B05D 5/12; H01L 39/00

(52) U.S. Cl. ...................... 505/236; 505/237; 428/930; 427/62

(58) Field of Search ................................ 505/236, 237; 428/930; 427/62

(56) References Cited

U.S. PATENT DOCUMENTS 4,994,435 A * 2/1991 Shiga et al. .................... 505/1

FOREIGN PATENT DOCUMENTS

| DE | 4107685 A1 | 9/1992 |
|---|---|---|
| DE | 4243439 A1 | 6/1994 |
| DE | 4418050 A1 | 1/1995 |
| DE | 4434819 C1 | 1/1996 |
| DE | 19520205 A1 | 12/1996 |
| EP | 281444 | 9/1988 |
| EP | 283313 | 9/1988 |
| EP | 300499 | 1/1989 |
| JP | 05251761 | 9/1993 |

OTHER PUBLICATIONS

Frey, Hartmut Dr.–Ing. et al., "Tieftemperaturtechnologie", VDI–Verlag GmbH, 1998, p. 121.

Reade, R.P. et al., "Characterization of Y–Ba–Cu–O thin films and yttria–stabilized zirconia intermediate layers on metal alloys grown by pulsed laser deposition", Appl. Phys. Lett. 59(6), Aug. 5, 1991, pp. 739–741.

Russo, R.E. et al., "Metal buffer layers and Y–Ba–Cu–O thin films on Pt and stainless steel using pulsed laser deposition", J. Appl. Phys. 68(3), Aug. 1, 1990, pp. 1354–1356.

Sadakata, N. et al., "Prepartion of aligned high $T_c$ superconducting composite tape by laser deposition process on metallic substrate", Cryogenics, vol. 31, Jul. 1991, pp. 676–679.

* cited by examiner

*Primary Examiner*—Brian K. Talbot
(74) *Attorney, Agent, or Firm*—Burns, Doane, Swecker & Mathis, L.L.P.

(57) ABSTRACT

Ceramic high-temperature superconductors (1) which are intended to be used as current limiters in alternating-current lines should have a bypass layer (2) whose electrical resistivity is increased by more than 10 times with respect to that of a pure noble-metal bypass layer. In order to achieve this, the noble-metal bypass layer (2) of the high-temperature superconductor (1), preferably of silver, is alloyed with a base metal, preferably Pb or Bi or Ga, by a thermal treatment. The ratio of the bypass layer thickness (d2) of the noble-metal bypass layer (2) to the superconductor layer thickness (d1) is adjusted to <1/5. A base-metal bypass layer (3) of steel whose electrical resistivity is in the range between 10 $\mu\Omega\times$cm and 100 $\mu\Omega\times$cm at 77 K is soldered on or applied under isostatic pressure over the noble-metal-containing bypass layer (2). The noble-metal bypass layer thickness d2 and the base-metal bypass layer thickness d3 are to be chosen so that the ratio $\rho 2/d2$ is $>0.5\times\rho 3/d3$, where $\rho 2$ and $\rho 3$ are the electrical resistivity of the noble-metal-containing bypass layer (2) and the base-metal bypass layer (3, 3'), respectively.

17 Claims, 1 Drawing Sheet

HIGH-TEMPERATURE SUPERCONDUCTOR ARRANGEMENT

BACKGROUND OF THE INVENTION

1. Field of the Invention

The invention relates to a high-temperature superconductor arrangement comprising a layered ceramic high temperature superconductor

2. Discussion of Background

DE 4418050 A1 disclosed a hollow cylindrical high-temperature superconductor which has a wall thickness of 3 mm and is suitable for current-limiter applications and which may be coated on one or both sides with a 1 $\mu$m thick silver layer. Applied to the latter or directly to the internal surface of the high-temperature superconductor may be a 10 $\mu$m thick 2nd metal layer or metal foil of silver or aluminum or a 100 $\mu$m thick layer or foil of lead or antimony or indium or bismuth or steel or tin or zinc or of an alloy of said metals. These layers are wrapped around with an elastic steel wire and fixed by a solder or a cold-resistant synthetic resin or epoxy resin.

To use a high-temperature superconductor as current limiter in alternating-current lines, in particular for electrical powers of $\geq 1$ MW, it is desirable to use an electrical bypass whose electrical resistance is less than that of the high-temperature superconductor in the non-superconducting state since critical hot spots may otherwise occur. In particular, the ceramic high-temperature superconductor should haves a bypass layer whose electrical resistivity is increased by more than 10 times with respect to that of a pure noble-metal bypass layer in order to enable an economical current limiting.

The American Institute of Physics Handbook, edited by D. E. Gray, McGraw-Hill Book Company, New York 1965, 3rd edition, pages 9–42 discloses, inter alia, that the electrical resistivity of bismuth is 30 $\mu\Omega\times$cm at 80 K.

DE 4107685 A1 discloses a superconducting current limiter in which a 2 mm wide or 2 mm thick bifilarly wound ceramic superconductor is connected to a carrier of ceramic, diamond or metal via an electrically insulating layer of zirconium dioxide, strontium titanate or diamond.

SUMMARY OF THE INVENTION

Accordingly, one object of the invention, is to improve a high-temperature superconductor arrangement of the type mentioned at the outset so that no separate hot spots occur when it is used as current limiter for electrical powers of $\geq 1$ MW.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings wherein.

DESCRIPTION OF THE PREFERRED EMBODIMENTS

Figure 1:
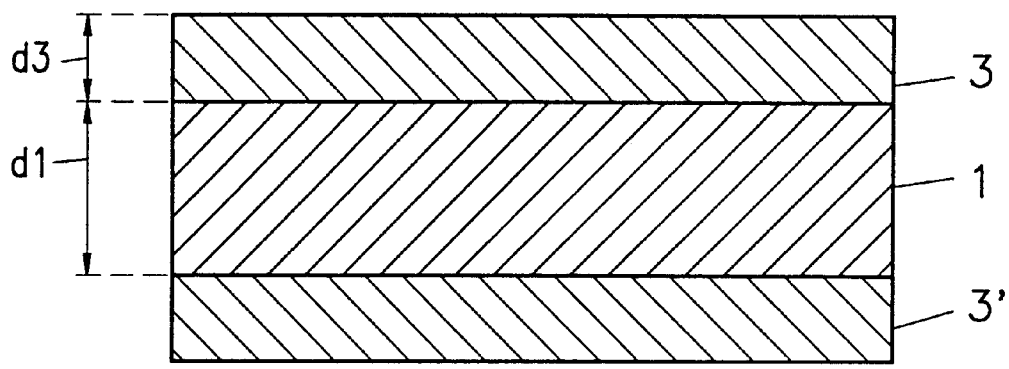
FIG. 1 shows a high-temperature superconductor with two directly adjoining steel bypass layers and FIG. 2 shows a layer sequence of a high-temperature superconductor having a plurality of bypass layers on one of its principle surfaces and a carrier layer on its 2nd principal surface.

Referring now to the drawings, wherein like reference numerals designate identical or corresponding parts throughout the several views, in FIG. 1, a layer of a ceramic high-temperature superconductor (1) which has a uniform superconductor layer thickness (d1) in the 50 $\mu$m–2 mm range, preferably in the 100 $\mu$m–400 $\mu$m range, is in good electrical and thermally conducting contact via each of its two principle surfaces with a nonmagnetic base-metal bypass layer (3, 3') in each case, preferably of Ni—Cr-steel containing 18% Ni and 8% Cr or of a nickel alloy containing varying amounts of Mo, Cr, Mn, Cu, Si, Fe, such as is known under the trade name Hastelloy, or of a Cu—Ni alloy. Each base-metal bypass layer (3, 3') has a uniform base-metal bypass layer thickness (d3) of <1 mm, preferably of <500 $\mu$m. The base-metal bypass layers (3, 3') at the same time serve as heat sinks.

Figure 2:
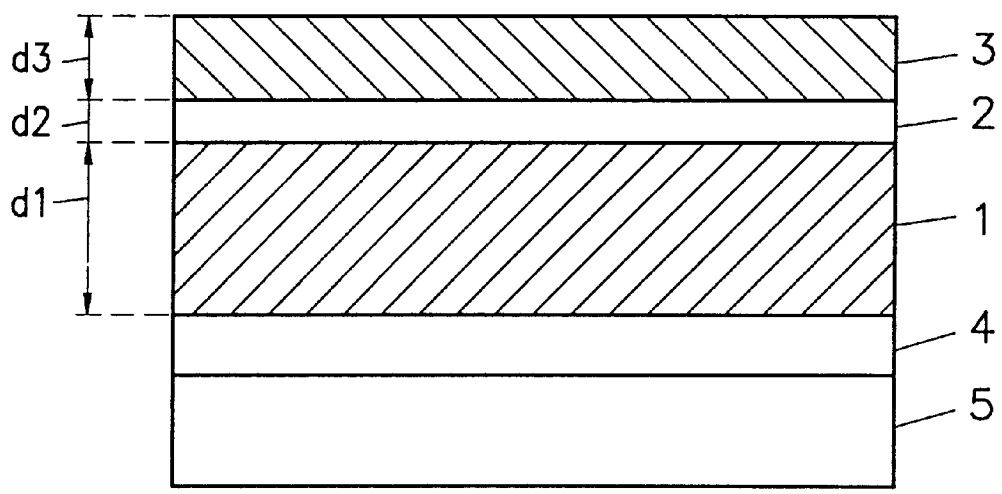

In the embodiment according to FIG. 2, there is provided between the high-temperature superconductor (1) and a nonmagnetic, thermally conductive base-metal bypass layer (3) a noble-metal bypass layer (2), preferably of silver or of a silver alloy, which has a bypass layer thickness or noble-metal bypass layer thickness (d2) in the 10 $\mu$m–300 $\mu$m range, preferably in the 10 $\mu$m–50 $\mu$m range. The base-metal bypass layer (3) is pressed isostatically against the noble-metal- containing bypass layer (2); it could also be bonded or soldered on. The superconductor layer thickness (d1) is in the 0.5 $\mu$m–5 $\mu$m range.

The high-temperature superconductor (1) is preferably yttrium-containing or of the type: $Bi_{2+x}EA_3Cu_2O_y$, where $-0.15 < x < 0.4$, $8 \leq y \leq 8.3$ and EA=an alkaline earth metal or a mixture of alkaline earth metals, in particular a mixture of Sr and Ca in the ratio $$Sr: Ca=(2+z):(1-z) \text{ where } 0<z<0.2.$$

The noble-metal bypass layer (2) is preferably composed of silver (Ag) which is alloyed with lead (Pb) and/or bismuth (Bi) and/or tin (Sn) and/or indium (In) and/or gallium (Ga) and/or aluminum (Al) and/or mercury (Hg), preferably with lead or bismuth or gallium.

The noble-metal bypass layer (2), for example with a 65Bi30Pb5Ag alloy having a melting point of 120° C., is alloyed preferably by diffusing the base metals by means of a thermal treatment.

The ratio of the bypass layer thickness (d2) of the noble-metal bypass layer (2) to the superconductor layer thickness (d1) should be adjusted to <1/5.

The 2nd principle surface of the high-temperature superconductor (1) is in contact via an electrically insulating layer (4) with a carrier layer (5) for the purpose of mechanical stabilization of the high-temperature superconductor arrangement. The insulating layer (4) is preferably composed of zirconium dioxide $ZrO_2$ or cerium(III) oxide $Ce_2O_3$. The carrier layer (5) is preferably composed of a steel strip or of sapphire. On the other hand, a fiber-reinforced plastic can also be used, in which case the insulating layer (4) can be omitted.

It is important that the electrical resistivity of each of said base-metal bypass layers (3, 3') is in the range between 10 $\mu\Omega\times$cm and 100 $\mu\Omega\times$cm at 77 K. If a steel layer is used as base-metal bypass layer (3, 3'), the steel layer thickness (d3) should be in the 200 $\mu$m–2 mm range, preferably in the 200 $\mu$m–500 $\mu$m range.

The noble-metal bypass layer thickness d2 and the base-metal bypass layer thickness d3 are to be chosen so that the ratio $\rho 2/d2 > 0.5 \times \rho 3/d3$, where $\rho 2$ and $\rho 3$ are the electrical resistivity of the noble-metal-containing bypass layer (2) and the base-metal bypass layer (3, 3'), respectively.

Simultaneously, it is essential that:

$$\frac{1}{j_c \cdot d1} \cdot \frac{1}{50} \frac{V}{\text{cm}} \leq \frac{\rho 3}{d3} \leq \frac{1}{j_c^2 \cdot d1^2} \cdot 50 \frac{W}{\text{cm}^2},$$

where $j_c$ is the critical current density of the high-temperature superconductor (1) measured in A/cm$^2$, d1 is the thickness of the high-temperature superconductor (1) measured in cm, d3 is the thickness and ρ3 is the electrical resistivity of the base-metal bypass layer (3,3') measured in cm and Ω·cm respectively.

Exemplary Embodiment 1

To produce this high-temperature semiconductor arrangement a thin layer of solder which melts at 120° C. is deposited on a 0.5 mm thick steel plate provided with holes. This steel plate with its solder layer is then placed on the noble-metal-containing bypass layer (2) of the finished high-temperature superconductor (1) (having an insulating layer (4) and a carrier layer (5)) and heated under vacuum at 120° C. for 10 min, and then cooled to room temperature. The steel plate is thereby soldered to the noble-metal-containing bypass layer (2).

Exemplary Embodiment 2

A perforated steel plate (3) is bonded onto a high-temperature superconductor (1) having a silver layer (2) on the superconductor side by means of an electrically conductive epoxy resin. The silver layer is then removed mechanically and a further steel layer (3') is applied to the opposite principle surface of the high-temperature superconductor (1).

Obviously, numerous modifications and variations of the present invention are possible in light of the above teachings. It is therefore to be understood that within the scope of the appended claims, the invention may be practiced otherwise than as specifically described herein.

What is claimed is:

1. A high-temperature superconductor arrangement
   a) comprising a layered ceramic high-temperature superconductor;
   b) which is in thermally and electrically conducting contact via at least one of its two principle surfaces with at least one electrical base-metal bypass layer;
   c) a noble-metal-containing bypass layer being disposed between the high-temperature superconductor and the at least one base-metal bypass layer;
   d) wherein the electrical resistivity (ρ3) of said at least one base-metal bypass layer is in the range between 10 μΩ·cm and 100 μΩcm at 77 K;
   e) wherein the ratio of the noble-metal bypass layer thickness (d2) to the superconductor layer thickness (d1) is 1/5;
   f) wherein the superconductor layer thickness (d1) is in the 0.5 μm–2 mm range; and
   g) wherein $$\frac{1}{j_c \cdot d1} \cdot \frac{1}{50} \frac{V}{\text{cm}} \leq \frac{\rho 3}{d3} \leq \frac{1}{j_c^2 \cdot d1^2} \cdot 50 \frac{W}{\text{cm}^2},$$

where d1 is thickness in cm of the high-temperature superconductor, ρ3 is electrical resistivity in Ω·cm of the base-metal bypass layer, d3 is thickness in cm of the base-metal bypass layer thickness, and $j_c$ is critical current density in A/cm$^2$ of the high-temperature superconductor.

2. The high-temperature superconductor arrangement as claimed in claim 1, wherein the ratio ρ2/d2>0.5×ρ3/d3, where ρ2 is electrical resistivity in Ω·cm of the noble-metal-containing bypass layer and d2 is thickness in cm of the noble-metal-containing bypass layer.

3. A high-temperature superconductor arrangement
   a) comprising a layered ceramic high-temperature superconductor;
   b) which is in thermally and electrically conducting contact via at least one of its two principle surfaces with at least one electrical base-metal bypass layer;
   c) a noble-metal-containing bypass layer being disposed between the high-temperature superconductor and the at least one base-metal bypass layer;
   d) wherein the electrical resistivity of said at least one base-metal bypass layer is in the range between 10 μΩ·cm and 100 μΩ·cm at 77 K;
   e) wherein the ratio of the noble-metal bypass layer thickness (d2) to the superconductor layer thickness (d1) being 1/5;
   f) wherein the superconductor layer thickness (d1) is in the 0.5 μm–5 μm range; and
   g) wherein, via one of its two principle surfaces the high-temperature superconductor is in contact via an electrically insulating layer with a mechanically stabilizing carrier layer.

4. A high-temperature superconductor arrangement
   a) comprising a layered ceramic high-temperature superconductor;
   b) which is in thermally and electrically conducting contact via at least one of its two principle surfaces with at least one electrical base-metal bypass layer;
   c) wherein the electrical resistivity of said at least one base-metal bypass layer is in the range between 10 μΩ·cm and 100 μΩ·cm at 77 K;
   d) wherein the superconductor layer thickness (d1) is in the 50 μcm–2 mm range; and
   e) wherein the base-metal bypass layer is soldered or bonded on the superconductor layer and the at least one base-metal bypass layer is a steel layer.

5. A high-temperature superconductor arrangement
   a) comprising a layered ceramic high-temperature superconductor;
   b) which is in thermally and electrically conducting contact via at least one of its two principle surfaces with at least one electrical base-metal bypass layer;
   c) wherein the electrical resistivity of said at least one base-metal bypass layer is in the range between 10 μΩ·cm and 100 μΩ·cm at 77 K;
   d) wherein the superconductor layer thickness (d1) is in the 50 μm–2 mm range; and
   e) wherein the base-metal bypass layer is bonded on the superconductor layer by means of an electrically conductive epoxy resin layer.

6. The high-temperature superconductor arrangement as claimed in claim 5, wherein the at least one base-metal bypass layer has a thickness (d3) in the 200 μm–2 mm range.

7. The high-temperature superconductor arrangement as claimed in claim 4, wherein a noble-metal containing bypass layer is disposed between the high-temperature superconductor and the at least one base-metal bypass layer.

8. The high-temperature superconductor arrangement as claimed in claim 7, wherein the ratio ρ2/d2>0.5×ρ3/d3, wherein ρ2 and ρ3 are the electrical resistivity of the noble-metal-containing bypass layer and the base-metal bypass layer, respectively, and d2 and d3, respectively, are their layer thickness.

9. A method for producing a high-temperature superconductor arrangement, comprising the steps of
   a) producing a layered ceramic high-temperature superconductor with a layer thickness in the 50 μm–2 mm range; and
   b) soldering or bonding at least one electrical base-metal bypass layer with an electrical resistivity in the range between 10 μΩ·cm and 100 μΩ·cm at 77 K to at least one principle surface of the layered superconductor so as to provide a solder or bond layer therebetween, wherein the at least one base-metal bypass layer is a steel layer.

10. A method for producing a high-temperature superconductor arrangement, comprising the steps of
   a) producing a layered ceramic high-temperature superconductor with a layer thickness in the 50 μm–2 mm range; and
   b) bonding at least one electrical base-metal bypass layer to at least one principle surface of the layered superconductor, the base-metal bypass layer being bonded on the superconductor layer by means of an electrically conductive epoxy resin layer.

11. The method as claimed in claim 9, wherein the at least one base-metal bypass layer has a thickness (d3) in the 200 μm–2 mm range.

12. The method as claimed in claim 9, wherein a noble-metal-containing bypass layer is disposed between the high-temperature superconductor and the at least one base-metal bypass layer.

13. The method as claimed in claim 12, wherein the ratio $\rho2/d2 > 0.5 \times \rho3/d3$, where $\rho2$ and $\rho3$ are the electrical resistivity of the noble-metal-containing bypass layer and the base-metal bypass layer, respectively, and d2 and d3, respectively, are their layer thickness.

14. The high-temperature superconductor arrangement as claimed in claim 13, wherein the at least one base-metal bypass layer is a steel layer having a base-metal bypass layer thickness (d3) in the 200 μm–2 mm range.

15. The high-temperature superconductor arrangement as claimed in claim 5, wherein a noble-metal containing bypass layer is disposed between the high-temperature superconductor and the at least one base-metal bypass layer.

16. The method as claimed in claim 10, wherein the at least one base-metal bypass layer is a steel layer having a base-metal bypass layer thickness (d3) in the 200 μm–2 mm range.

17. The method as claimed in claim 10, wherein a noble-metal-containing bypass layer is disposed between the high-temperature superconductor and the at least one base-metal bypass layer.

* * * * *